(12) United States Patent
Cheng et al.

(10) Patent No.: US 10,627,680 B2
(45) Date of Patent: Apr. 21, 2020

(54) DISPLAY PANEL AND DISPLAY DEVICE

(71) Applicant: BOE TECHNOLOGY GROUP CO., LTD., Beijing (CN)

(72) Inventors: Hongfei Cheng, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/935,677

(22) Filed: Mar. 26, 2018

(65) Prior Publication Data

US 2019/0064607 A1 Feb. 28, 2019

(30) Foreign Application Priority Data

Aug. 22, 2017 (CN) .......................... 2017 1 0725885

(51) Int. Cl.
*G02F 1/1343* (2006.01)
*G02F 1/1345* (2006.01)
*G02F 1/1362* (2006.01)
*G02F 1/1335* (2006.01)
(Continued)

(52) U.S. Cl.
CPC ...... *G02F 1/134309* (2013.01); *G02F 1/1345* (2013.01); *G02F 1/133514* (2013.01); *G02F 1/134336* (2013.01); *G02F 1/136209* (2013.01); *G02F 1/136286* (2013.01); *H01L 27/124* (2013.01); *G02F 1/1368* (2013.01); *G02F 1/13439* (2013.01); *G02F 2001/134318* (2013.01); *G02F 2001/134372* (2013.01); *G02F 2001/136222* (2013.01); *G02F 2001/136295* (2013.01); *G02F 2201/121* (2013.01); *G02F 2201/122* (2013.01); *G02F 2201/123* (2013.01)

(58) Field of Classification Search
CPC ................................................ G02F 1/136209
See application file for complete search history.

(56) References Cited

U.S. PATENT DOCUMENTS

| 2007/0026556 A1 | 2/2007 | Kitagawa et al. |
| 2012/0050643 A1 | 3/2012 | Li et al. |
| 2016/0306220 A1 | 10/2016 | Zhang et al. |

FOREIGN PATENT DOCUMENTS

| CN | 201788341 U | 4/2011 |
| CN | 104298040 A | 1/2015 |
| CN | 106855762 A | 6/2017 |

(Continued)

OTHER PUBLICATIONS

First Office Action issued in corresponding Chinese Application No. 201710725885.5, dated Sep. 23, 2019, with English translation.

*Primary Examiner* — Walter H Swanson
(74) *Attorney, Agent, or Firm* — McDermott Will & Emery LLP

(57) ABSTRACT

A display panel comprises a base substrate and a plurality of gate lines and data lines arranged on the base substrate. The gate lines and the data lines are crisscrossed to define a plurality of pixel regions. The display panel further comprises pixel electrodes arranged within the pixel regions and common electrodes arranged in opposite to the pixel electrodes, wherein an orthographic projection of the common electrodes on the substrate is not overlapped with an orthographic projection of the gate lines on the substrate, and/or the orthographic projection of the common electrodes on the substrate is not overlapped with an orthographic projection of the data lines on the substrate.

10 Claims, 6 Drawing Sheets

(51) Int. Cl.
*H01L 27/12* (2006.01)
*G02F 1/1368* (2006.01)

(56) References Cited

FOREIGN PATENT DOCUMENTS

| | | |
|---|---|---|
| CN | 106886108 A | 6/2017 |
| EP | 2743766 A1 | 6/2014 |

DISPLAY PANEL AND DISPLAY DEVICE

CROSS-REFERENCE TO RELATED APPLICATION

This application claims priority to Chinese Patent Application No. 201710725885.5, filed on Aug. 22, 2017, titled "DISPLAY PANEL AND DISPLAY DEVICE", which is incorporated herein by reference in its entirety.

TECHNICAL FIELD

The present disclosure relates to the technical field of display, and in particular to a display panel and a display device.

BACKGROUND

As one of the widely used display technologies at present, the liquid crystal display technology is widely applied in TV sets, mobile phones, public information displays and other fields. A liquid crystal screen consists of an array substrate and an opposing substrate, and liquid crystal material is encapsulated between the array substrate and the opposing substrate. The array substrate includes gate lines and data lines which are crisscrossed to define pixel units.

By taking a TN (Twist Nematic) type liquid crystal display device as an example, independent pixel electrodes corresponding to the pixel units are arranged on the array substrate, integrally designed common electrodes are arranged on the opposing substrate, and an electric field is formed between the common electrode and the pixel electrode to drive the liquid crystal to display.

SUMMARY

In one aspect, the present disclosure provides a display panel, including a base substrate and a plurality of gate lines and a plurality of data lines arranged on the base substrate, with the gate lines and the data lines being crisscrossed to define a plurality of pixel regions, and further comprising pixel electrodes one of which arranged within each of the pixel regions, wherein the display panel further includes common electrodes arranged in opposite to the pixel electrodes; and, an orthographic projection of the common electrodes on the base substrate is not overlapped with an orthographic projection of the gate lines on the base substrate, and/or the orthographic projection of the common electrodes on the base substrate is not overlapped with an orthographic projection of the data lines on the base substrate.

As an optional implementation, the plurality of pixel regions are arranged in an array; and, the common electrodes are strip-shaped and arranged between two adjacent gate lines, and one common electrode corresponds to a row of the pixel electrodes.

As another optional implementation, the plurality of pixel regions are arranged in an array; and, the common electrodes are strip-shaped and arranged between two adjacent data lines, and one common electrode corresponds to a column of the pixel electrodes.

As still another optional implementation, the plurality of pixel regions are arranged in an array; the common electrodes are blocky and one of which is arranged within each of the pixel regions; the display panel further includes a plurality of first connection electrodes and a plurality of second connection electrodes; and, each of the common electrode is electrically connected to another opposite common electrode in an adjacent row via the first connection electrode, and each of the common electrodes is electrically connected to another opposite common electrode in an adjacent column via the second connection electrode.

For example, the width of each of the first connection electrodes in a row direction may be less than ¼ of the length of an adjacent pixel electrode in the row direction which is adjacent to the first connection electrode on any side of the first connection electrode in the column direction; and/or, the width of each of the second connection electrodes in a column direction may be less than ¼ of the length of an adjacent pixel electrode in the column direction which is adjacent to the second connection electrode on any side of the second connection electrode in the row direction.

Optionally, the display panel is provided with a display region, and the common electrodes are located within the display region; and, the display panel further includes a common electrode frame arranged in the same layer as the common electrodes, with the common electrode frame being located outside the display region, the first row of the common electrodes and the last row of the common electrodes being connected to the common electrode frame via the first connection electrodes, and the first column of the common electrodes and the last column of the common electrodes being connected to the common electrode frame via the second connection electrodes.

Optionally, the display panel is provided with a display region; the common electrodes are at least located within the display region; the display panel further includes a common electrode frame arranged in the same layer as the common electrodes; and, the common electrode frame is located outside the display region and connected to each of the common electrodes corresponding to each row of the pixel electrodes.

Optionally, the display panel is provided with a display region, and the common electrodes are at least located within the display region; and the display panel further comprises a common electrode frame arranged in the same layer as the common electrodes, and the common electrode frame is located outside the display region and connected to each of the common electrodes corresponding to each column of the pixel electrodes.

Optionally, the display panel further includes a black matrix and a color film layer; the black matrix is located between the base substrate and a layer where the pixel electrodes are located; the black matrix includes hollow regions in one-to-one correspondence to the pixel electrodes; the color film layer includes color film blocks in one-to-one correspondence to the pixel electrodes; and, each of the color film blocks is at least partially located within the hollow region.

On this basis, preferably, the display panel further includes an opposing substrate arranged in opposite to the base substrate; all the gate lines, the data lines and the pixel electrodes are arranged on a side of the base substrate facing the opposing substrate; and, the common electrodes are arranged on a side of the opposing substrate facing the base substrate.

On this basis, preferably, all the gate lines, the data lines, the pixel electrodes and the common electrodes are arranged on the base substrate; the common electrodes are located between the base substrate and the pixel electrodes, and slits are formed on the pixel electrodes; or, the pixel electrodes are located between the base substrate and the common electrodes, and slits are formed on the common electrodes.

In another aspect, the present disclosure further provides a display device, including the display panel described above.

BRIEF DESCRIPTION OF THE DRAWINGS

To describe the technical solutions in the embodiments of the present disclosure more clearly, the accompanying drawings to be used in the descriptions of the embodiments will be briefly described below. Apparently, the accompanying drawings described hereinafter are some of embodiments of the present disclosure, and a person skilled in the art can obtain other accompanying drawings according to these drawings without paying any creative effort.

DETAILED DESCRIPTION

Figure 1:
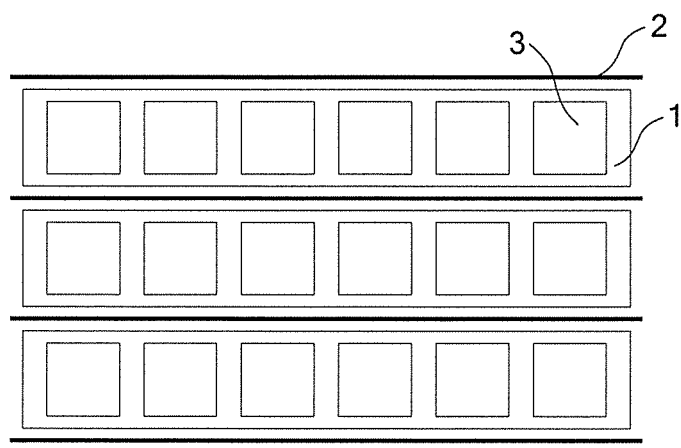
FIG. 1 is a first top view of a display panel according to the embodiments of the present disclosure.

The technical solutions in the embodiments of the present disclosure will be clearly and completely described below with reference to the accompanying drawings in the embodiments of the present disclosure. Apparently, the embodiments described herein are merely a part but not all of the embodiments of the present disclosure. All other embodiments obtained by a person skilled in the art without paying any creative effort on the basis of the embodiments in the present disclosure shall fall into the protection scope of the present disclosure.

It is to be noted that, unless otherwise defined, all terms (including technical and scientific terms) used in the embodiments of the present disclosure have the same meanings as the common meanings interpreted by a person skilled in the art. It should also be understood that, unless otherwise specifically defined, terms such as those generally defined in the dictionary should be interpreted as having meanings consistent with their meanings in the context of related techniques, and should not be interpreted as idealized or extremely formalized meanings.

For example, the terms "first", "second" and similar words used in the description and the appended claims of the present disclosure do not indicate any order, quantity or importance and are merely used for distinguishing different components. "Include/Including", "contain/containing", "comprise/comprising" or similar words mean that an element or object before this word encompasses elements, objects or equivalents thereof listed behind this word and does not exclude other elements or objects. The orientation or position relation indicated by the terms "upper/above", "lower/below", "one side", "the other side" or the like is an orientation or position relation shown based on the accompanying drawings, merely for explaining the simplified description of the technical solutions of the present disclosure but not for indicating or implying that the specified device or element must have a particular orientation or be constructed and operated in a particular orientation. Therefore, these terms cannot be interpreted as limitations to the present disclosure.

It has been known that, independent pixel electrodes corresponding to the pixel units are arranged on the array substrate and integrally designed common electrodes are arranged on the opposing substrate in a conventional liquid display device. Since the common electrodes are designed integrally, that is, a big electrode corresponds to each pixel unit, stray capacitance will be generated within regions where the common electrodes are overlapped with gate lines and data lines, so that signals on the gate lines and the data lines are distorted during transmission and the display quality is influenced.

An embodiment of the present disclosure provides a display panel, comprising a base substrate and a plurality of gate lines and a plurality of data lines arranged on the base substrate. The gate lines and the data lines are crisscrossed to define a plurality of pixel regions. The display panel further comprises a pixel electrode arranged within each of the pixel regions. The display panel further comprises common electrodes arranged in opposite to the pixel electrodes. An orthographic projection of the common electrodes on the base substrate is not overlapped with an orthographic projection of the gate lines on the base substrate, and/or the orthographic projection of the common electrodes on the base substrate is not overlapped with an orthographic projection of the data lines on the base substrate.

It is to be noted that, of course, the display panel further comprises Thin Film Transistors (TFTs) which are formed on the base substrate and located at intersections of the data lines with the data lines. The gate lines are connected to gates of the TFTs to control the ON or OFF of the TFTs, and the pixel electrodes within the pixel regions are connected to the data lines via corresponding TFTs so as to realize display.

On this basis, in the embodiments of the present disclosure, by adjusting the pattern of common electrodes to not allow the common electrodes to overlap with adjacent gate lines or adjacent data lines or both gate lines and data lines, the influence of the gate lines and/or data lines on signal transmission due to the presence of stray capacitance can be reduced, and the display quality can thus be improved.

The plurality of pixel regions defined by the crisscross of the gate lines and the data lines are generally arranged in an array, that is, there are multiple rows of pixel regions and multiple columns of pixels regions. Therefore, on this basis, further, the pattern and arrangement mode of the common electrodes may specifically include, but not limited to, the following three modes.

Mode 1:

As shown in FIG. 1, the common electrodes 1 are strip-shaped and arranged between two adjacent gate lines 2, and one common electrode 1 corresponds to one row of pixel electrodes 3.

That is, the common electrodes 1 are not overlapped with the gate lines 2 in order to reduce stray capacitance generated on the gate lines 2.

Figure 2:
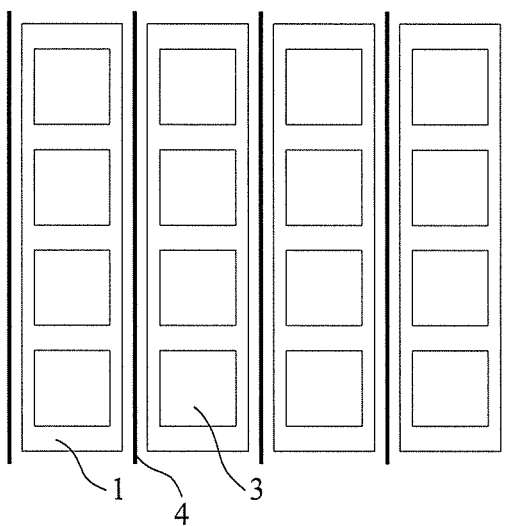
FIG. 2 is a second top view of a display panel according to the embodiments of the present disclosure.

Mode 2:

As shown in FIG. 2, the common electrodes 1 are strip-shaped and arranged between two adjacent data lines 4, and one common electrode 1 corresponds to one column of pixel electrodes 3.

That is, the common electrodes 1 are not overlapped with the data lines 4 in order to reduce stray capacitance generated on the data lines 4.

Figure 3:
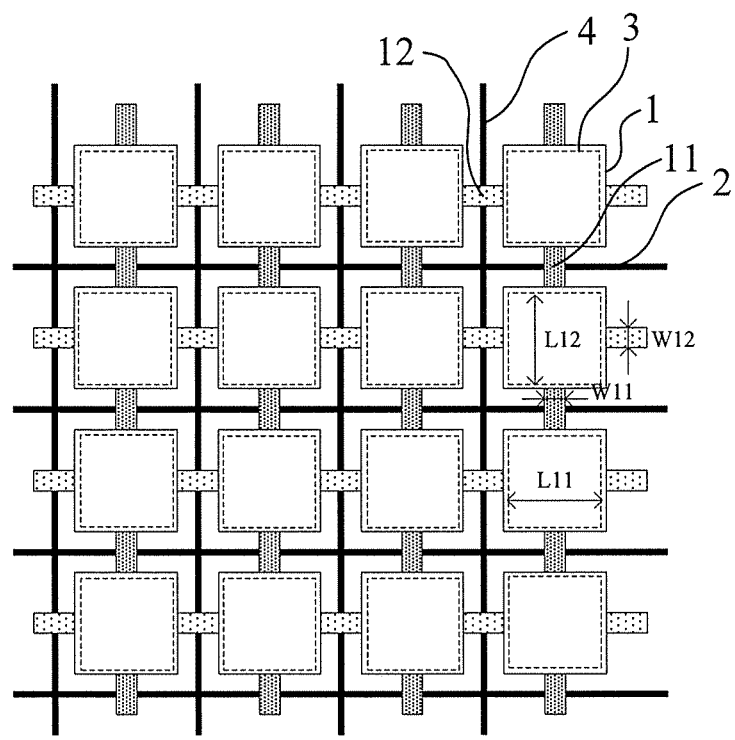
FIG. 3 is a third top view of a display panel according to the embodiments of the present disclosure.

Mode 3:

As shown in FIG. 3, the common electrodes 1 are blocky and one common electrode 1 is arranged within each of the pixel regions, that is, the common electrodes 1 are not overlapped with both the gate lines 2 and the data lines 4. Since each common electrode 1 is an independent block, in order to connect adjacent common electrodes 1 to receive common signals, the display panel further comprises a plurality of first connection electrodes 11 and a plurality of second connection electrodes 12. Each common electrode 1 is electrically connected to another opposite common electrode in an adjacent row via the first connection electrode 11, and each common electrode 1 is electrically connected to another opposite common electrode 1 in an adjacent column via the second connection electrode 12.

Since the first connection electrodes 11 and the second connection electrodes 12 merely function to connect adjacent common electrodes 1, the first connection electrodes and the second connection electrodes may be fabricated to be narrow to reduce the overlap area of the first connection electrodes 11 with the gate lines 2 and the overlap area of the second connection electrodes 12 with the data lines, so that the stray capacitance generated on the gate lines 2 and the data lines 4 is reduced.

For the three design modes for the common electrodes further provided in the embodiments of the present disclosure, the following points should be noted.

First, as mentioned herein, the terms such as "row/row direction" or "column/column direction" for indicating the position and direction are based on the direction viewed from the front face of the paper of the corresponding drawing. The terms for indicating the position and direction merely indicates the relative positional relationship in the situation shown by the drawing, and are merely for purpose of description and not intended to limit the scope of the present disclosure. For example, in some cases, embodiments involving the "row direction" may be implemented in the "column direction" or the like; and vice versa. Further, the solutions of the present disclosure after being rotated by 90° or mirrored shall also fall into the protection scope of the present disclosure.

Second, the amounts of the common electrodes 1, the first connection electrodes 11, the second connection electrodes 12, the gate lines 2, the pixel electrodes 3 and the data lines 4 in FIGS. 1 to 3 are merely illustrative, and the specific amounts of the above structures will not be limited in the embodiments of the present disclosure and may be flexibly set according to the size of the display panel.

Third, in FIGS. 1 and 2, the description is given by taking the pixel electrodes 3 being only located above the common electrodes 1 (that is, the common electrodes 1 are located between the pixel electrodes 3 and the base substrate) as an example; and, the relation positions of the pixel electrodes 3 and the common electrodes 1 in the up-down direction may also be exchanged, that is, relative to the base substrate, the common electrodes 1 are located above the pixel electrodes 3. The specific structure may be designed flexibly.

Further, in the above mode 3, the width of each of the first connection electrodes 11 may be set in such a way that the width W11 of each of the first connection electrodes 11 in the row direction is less than ¼ of the length L11 of each of the adjacent pixel electrodes 3 in the row direction; and/or, the width of each of the second connection electrodes 12 may be set in such a way that the width W12 of each of the second connection electrodes 12 in the column direction is less than ¼ of the length L12 of each of the adjacent pixel electrodes 3 in the column direction.

As shown in FIG. 3, the adjacent pixel electrode of each first connection electrode 11 refers to a pixel electrode adjacent to the first connection electrode on any side of the first connection electrode in the column direction, that is, the pixel electrode on the upper or lower side of the first connection electrode 11. As shown in FIG. 3, the adjacent pixel electrode of each second connection electrode 12 refers to a pixel electrode adjacent to the second connection electrode on any side of the second connection electrode in the row direction, that is, the pixel electrode on the left or right side of the second connection electrode 12.

Some pixel electrodes 3 are illustrated in FIG. 3 in dashed line which are smaller than the common electrodes 1. It should be understood that, the illustration in FIG. 3 is only exemplary, and the pixel electrode 3 may be larger than or equivalent to the common electrode 1.

On this basis, when the display panel displays, a same signal (i.e., a common signal, generally ±5V) will be applied to the common electrodes. To conveniently provide the common electrodes with the same common signal, as for the mode 1 and the mode 2, the display panel is provided with a display region in the embodiments of the present disclosure; the common electrodes are at least located within the display region, and two ends of each of the strip-shaped common electrodes may extend outside the display region; and, the display panel further comprises a common electrode frame arranged in the same layer as the common electrodes, and the common electrode frame is located outside the display region and connected to each of the common electrodes.

Figure 4:
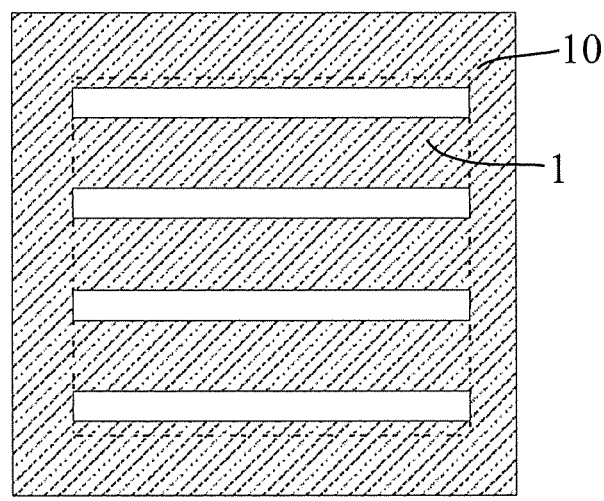
FIG. 4 is a plan view of a common electrode layer including common electrodes shown in FIG. 1.

For example, in the mode 1, the strip-shaped common electrodes 1 arranged at intervals in the row direction and the common electrode frame 10 form a common electrode layer, and the plan view of this common electrode layer is shown in FIG. 4, wherein, within the dotted line provides the display region, and the shaded area within the dotted line indicates the strip-shaped common electrodes 1 and the shaded area outside the dotted line indicates the common electrode frame 10. The common electrode frame 10 is located outside the display region, and two ends of each of the strip-shaped common electrodes 1 (i.e., left and right sides in the drawing) are connected to the common electrode frame 10.

Here, the strip-shaped common electrodes 1 and the common electrode frame 10 may be of an integral structure formed in one step, wherein hollow regions correspond to the gate lines 2, that is, the common electrodes 1 are arranged between two adjacent gate lines 2 and not overlapped with the two neighboring adjacent gate lines 2.

Figure 5:
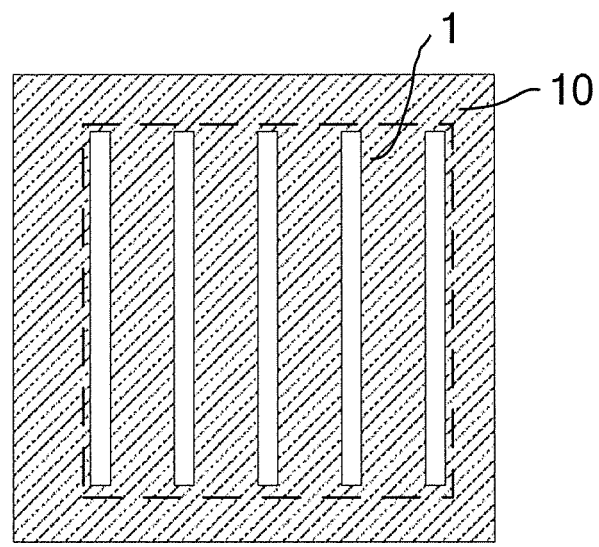
FIG. 5 is a plan view of a common electrode layer including common electrodes shown in FIG. 2.

For example, in the mode 2, the strip-shaped common electrodes 1 arranged at intervals in the column direction and the common electrode frame form a common electrode layer, and the planar structure of this common electrode layer is shown in FIG. 5, wherein, within the dotted line provides the display region, and the shaded area within the dotted line indicates the strip-shaped common electrodes 1 and the shaded area outside the dotted line indicates the common electrode frame 10. The common electrode frame 10 is located outside the display region, and two ends of each of the strip-shaped common electrodes 1 (i.e., upper and lower sides in the drawing) are connected to the common electrode frame 10.

Here, the strip-shaped common electrodes 1 and the common electrode frame 10 may be of an integral structure formed in one step, wherein hollow regions correspond to the data lines 4, that is, the common electrodes 1 are arranged between two adjacent data lines 4 and not overlapped with the two adjacent data lines 4.

In the mode 3, the display panel is provided with a display region; each of the blocky common electrodes 1 is located within the display region; the display panel further comprises a common electrode frame arranged in the same layer as the common electrodes; the common electrode frame is located outside the display region; the first row of common electrodes 1 and the last row of common electrodes 1 are connected to the common electrode frame via the first connection electrodes 11; and, the first column of common electrodes 1 and the last column of common electrodes 1 are connected to the common electrode frame via the second connection electrodes 12.

Figure 6:
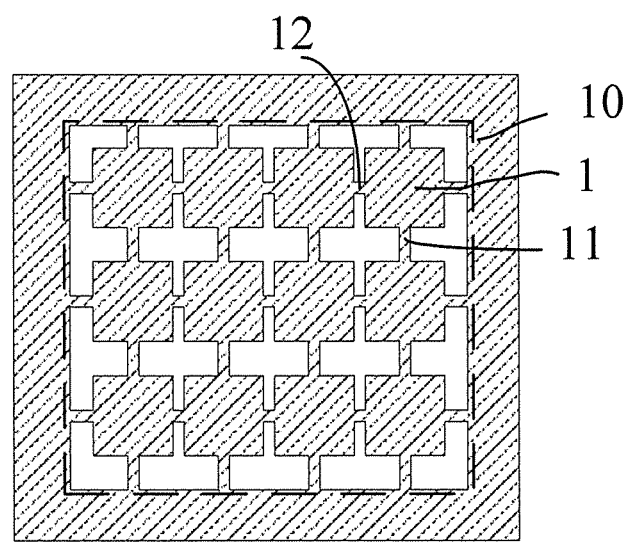
FIG. 6 is a plan view of a common electrode layer including common electrodes shown in FIG. 3.

The common electrodes 1 arranged at intervals in both the row direction and the column direction, the first connection electrodes 11, the second connection electrodes 12 and the common electrode frame 10 form a common electrode layer, and the planar structure of the common electrode layer is shown in FIG. 6, wherein, within the dotted line provides the display region, and the shaded area within the dotted line indicates the blocky common electrodes 1, the first connection electrodes 11 and the second connection electrodes 12, and the shaded area outside the dotted line indicates the common electrode frame 10. The common electrode frame 10 is located outside the display region, the outermost blocky common electrodes 1 in the row direction and the column direction are connected to the common electrode frame 10 via the corresponding first connection electrodes 11 and second connection electrodes 12, so that each of the blocky common electrodes 1 is electrically connected to the common electrode frame 10.

Here, the common electrodes 1, the first connection electrodes 11, the second connection electrodes 12 and the common electrode frame 10 may be of an integral structure formed in one step, and the common electrodes 1 are not overlapped with both the gate lines 2 and the data lines 4.

On this basis, the base substrate, on which the gate lines, the data lines, the TFTs and the pixel electrodes are at least provided, may be a Color Filter On Array (COA) substrate, i.e., an array substrate integrated with a color film layer. Correspondingly, the display panel further comprises a Black Matrix (for short, BM) and a color film layer. The BM is located between the base substrate and a layer where the pixel electrodes are located. The BM includes hollow regions in one-to-one correspondence to the pixel electrodes. The color film layer includes color film blocks in one-to-one correspondence to the pixel electrodes. Each of the color film blocks is at least partially located within the hollow region, that is, below the corresponding pixel electrode.

In other words, the color film blocks may be merely arranged within the hollow regions of the BM; or, the color film blocks may be arranged outside the hollow regions, and edges of the color film blocks may be lapped onto edges of the hollow regions of the BM, thereby reducing the light leakage at area where the color film blocks and the hollow regions of the BM located.

In this way, by providing the BM and the color film layer on the array substrate, the alignment accuracy of the color film blocks and the corresponding pixel regions can be reduced, the alignment deviation can be reduced, and it is advantageous to improve the aperture ratio. Meanwhile, the BM can occlude light leakage caused by the electric field between the edges of the common electrodes and the edges of the pixel electrodes.

On this basis, as a modification, the display panel further comprises an opposing substrate arranged in opposite to the base substrate. All the gate lines, the data lines and the pixel electrodes are arranged on a side of the base substrate facing the opposing substrate, and the common electrodes are arranged on a side of the opposing substrate facing the base substrate. In other words, the formed display panel may be of a TN type structure.

Or, all the gate lines, the data lines, the pixel electrodes and the common electrodes may also be on the base substrate. The common electrodes are located between the base substrate and the pixel electrodes, and slits are formed on the pixel electrodes; or, the pixel electrodes are located between the base substrate and the common electrodes, and slits are formed on the common electrodes.

In other words, the formed display panel may be of a Fringing Field Switch (FFS) type structure. Slits are further formed on ones of the pixel electrodes and the common electrodes which are located on an upper side relative to the base substrate, to improve the backlight transmittance of the display panel.

The following embodiments will be provided for describing the display panel in detail.

Some embodiments of the present disclosure provide a display panel which is applied to TN type liquid crystal devices.

Figure 7:
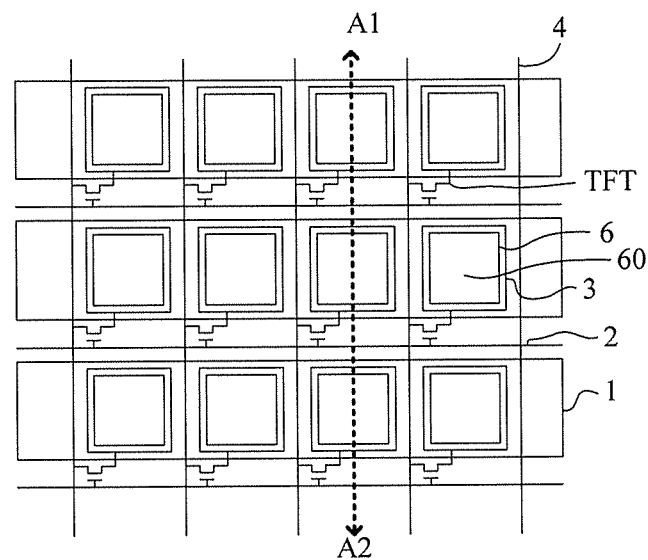
FIG. 7 is a top view of a display panel according to some embodiments of the present disclosure.

As shown in FIG. 7, gate lines 2 and data lines 4 are provided on a first substrate 51 (i.e., a base substrate). TFTs are provided at intersections of the gate lines 2 with the data lines 4. Pixel electrodes 3 are connected to the data lines 4 via the TFTs, and the gate lines 2 are connected to gates of the TFTs (marked by TFT in the drawing) to control the ON or OFF of the TFTs.

Figure 8:
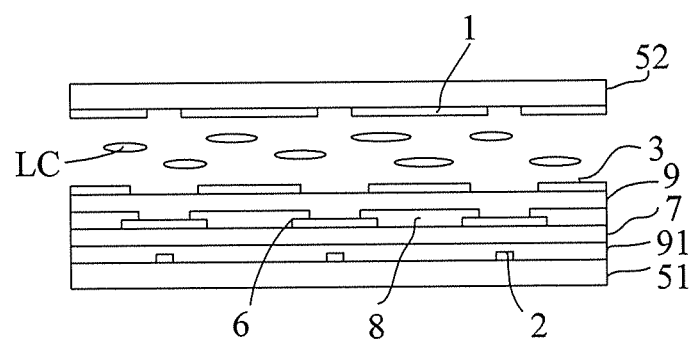
FIG. 8 is a sectional view of FIG. 7 along the line A1-A2.

As shown in FIG. 8, common electrodes 1 are provided on a second substrate 52 (i.e., an opposing substrate) arranged in opposite to the first substrate 51. A liquid crystal layer (marked by LC in the corresponding sectional view) is provided between the two substrates. The common electrodes 1 are strip-shaped. Each row of pixel electrodes 3 corresponds to one strip-shaped common electrode 1, and this strip-shaped common electrode 1 is located between two adjacent gate lines 2 and not overlapped with the two adjacent gate lines 2.

Referring to FIG. 4, a planar structure of a common electrode layer includes the strip-shaped common electrodes 1 and a common electrode frame 10. The common electrode frame 10 is located outside a display region, and each of the strip-shaped common electrodes 1 is connected to the common electrode frame 10.

It is to be noted that, due to the limitations in the sectional direction in the sectional view, some structures such as the data lines 1 and TFTs in FIG. 7 are not shown in FIG. 8, and the corresponding reference numerals are merely illustrated in FIG. 7.

Some embodiments of the present disclosure provide another display panel which is applied to TN type liquid crystal devices.

Figure 9:
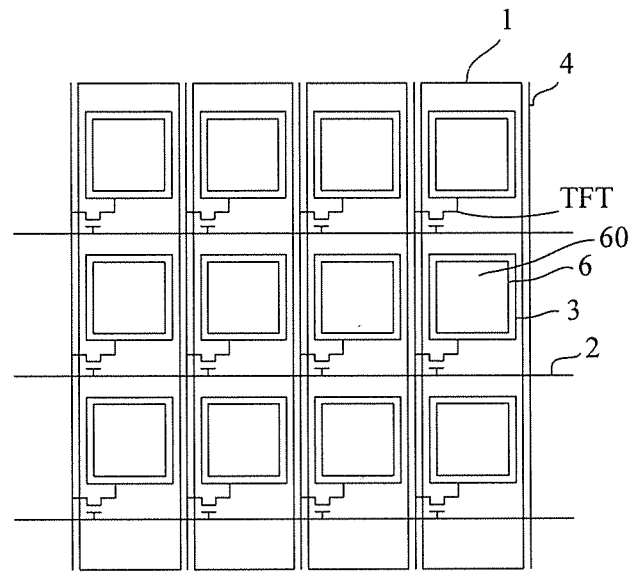
FIG. 9 is a top view of another display panel according to some embodiments of the present disclosure.

As shown in FIG. 9, gate lines 2 and data lines 4 are provided on a first substrate 51 (i.e., a base substrate). TFTs (marked by TFT in the drawing) are provided at intersections of the gate lines 2 with the data lines 4. Pixel electrodes 3 are connected to the data lines 4 via the TFTs, and the gate lines 2 are connected to gates of the TFTs to control the ON or OFF of the TFTs.

Common electrodes 1 are provided on a second substrate (i.e., an opposing substrate) arranged in opposite to the first substrate, and a liquid crystal layer is provided between the two substrates. The sectional structure may refer to FIG. 8, and will not be repeated here. The common electrodes 1 are strip-shaped. Each column of pixel electrodes 3 corresponds to one strip-shaped common electrode 1, and this strip-shaped common electrode 1 is located between two adjacent data lines 4 and not overlapped with the two adjacent data lines 4.

Referring to FIG. 5, a planar structure of a common electrode layer includes the strip-shaped common electrodes 1 and a common electrode frame 10. The common electrode frame 10 is located outside a display region, and each of the strip-shaped common electrodes 1 is connected to the common electrode frame 10.

Some embodiments of the present disclosure provide yet another display panel which is specifically applied to TN type liquid crystal devices.

Figure 10:
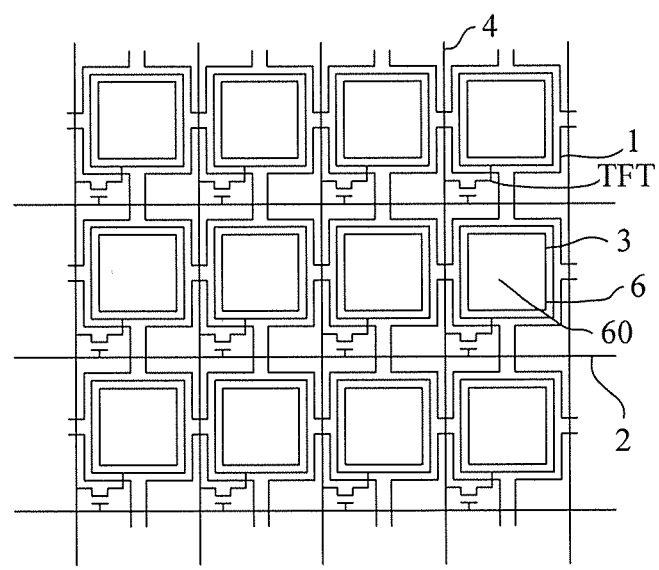
FIG. 10 is a top view of yet another display panel according to some embodiments of the present disclosure.

As shown in FIG. 10, gate lines 2 and data lines 4 are provided on a first substrate 51 (i.e., a base substrate). TFTs (marked by TFT in the drawing) are provided at intersections of the gate lines 2 with the data lines 4. Pixel electrodes 3 are connected to the data lines 4 via the TFTs, and the gate lines 2 are connected to gates of the TFTs to control the ON or OFF of the TFTs.

Common electrodes 1 are provided on a second substrate (i.e., an opposing substrate) arranged in opposite to the first substrate, and a liquid crystal layer is provided between the two substrates. The sectional structure may refer to FIG. 8, and will not be repeated here. Referring to FIG. 6, a planar structure of a common electrode layer includes the strip-shaped common electrodes 1, first connection electrodes 11, second connection electrodes 12 and a common electrode frame 10. The common electrode frame 10 is located outside a display region, and the outermost strip-shaped common electrodes 1 in the row direction and the column direction are connected to the common electrode frame 10 via the corresponding first connection electrodes 10 and second connection electrodes 12.

Although the first connection electrodes 11 are overlapped with the gate lines 2 and the data lines 4 and the second connection electrodes 12 are overlapped with the gate lines 2 and the data lines 4, the overlap area is very small. The width of each of the first connection electrodes 11 and the second connection electrodes 12 is less than ¼ of the length of edges of the pixel electrodes which are adjacent to them.

Some embodiments of the present disclosure provide yet another display panel which is specifically applied to FFS type liquid crystal devices.

Figure 11:
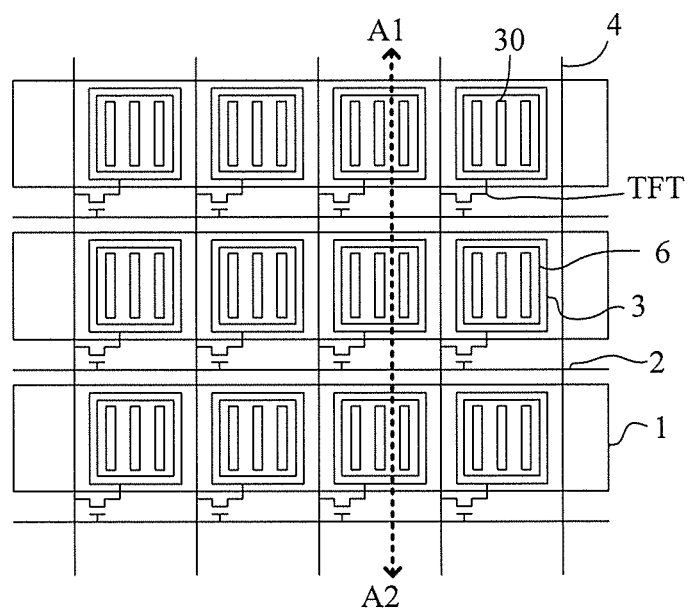
FIG. 11 is a top view of yet another display panel according to some embodiments of the present disclosure.
Figure 12:
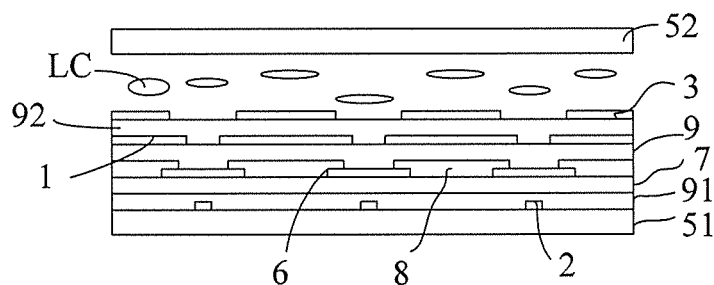
FIG. 12 is a sectional view of FIG. 11 along the line A1-A2.

As shown in FIGS. 11 and 12, all structures such as gate lines 2, data lines 4, TFTs (marked by TFT), pixel electrodes 3 and common electrodes 1 are provided on a first substrate 51 (i.e., a base substrate), so as to form an array substrate. A second substrate 52 arranged in opposite to the first substrate 51 is used for maintaining a liquid crystal cell gap, and a liquid crystal layer (marked by LC in the corresponding sectional view) is provided between the two substrates.

Slits 30 are formed on the pixel electrodes 3, the pixel electrodes 3 are located above the common electrodes 1, and a first insulating layer 92 is provided between the pixel electrodes 3 and the common electrodes 1. The common electrodes 1 are strip-shaped, and are located between two adjacent gate lines 2 and not overlapped with the two gate lines 2.

In the display panel illustrated in FIGS. 11 and 12, it is also possible that the common electrodes 1 are arranged above the pixel electrodes 3 and slits are correspondingly formed on the common electrodes 1.

Referring to FIGS. 7 to 12, the display panel in the embodiments further includes a black matrix 6 and a color film layer which are arranged on the base substrate. Both the black matrix 6 and the color film layer are provided on a passivation layer 7. The black matrix 6 includes hollow regions 60 in one-to-one correspondence to the pixel electrodes 3, and the color film layer includes color film blocks 8 in one-to-one correspondence to the pixel electrodes 3. The color film blocks 8 are located within the hollow regions 60 and lapped onto edges of the hollow regions 60 of the black matrix 6. The pixel electrodes 3 are separated from the black matrix 6 and the color film layer through a flattening layer 9.

A pattern layer including gate lines, gates and gate line wirings and a pattern layer including data lines, sources, drains and data line wirings in the embodiments may be made of elementary metal material such as Cu, Al, Mo, Ti, Cr or W, or may be made of alloys of these material. The specific structure of each pattern layer may be of a single-layer structure or a multi-layer structure, for example, a stacked structure such as Mo\Al\Mo, Ti\Cu\Ti or Mo\Ti\Cu.

The TFTs may be amorphous silicon TFTs, polycrystalline silicon TFTs or oxide semiconductor TFTs, and may be of a top-gate type structure or a bottom-gate type structure.

In some TFT structures, gates of the TFTs may be parts of the gate lines 2 (that is, there is no independent gate patterns extended from the gate lines), and sources of the TFTs may be parts of the data liens 4 (that is, there is no independent source pattern extended from the data lines). In the embodiments of the present disclosure, the specific structure of the TFTs will not be limited and may employ various TFT structures in the prior art, or the type and/or structure of the TFTs may be selected flexibly according to the specific structural requirements of the display panel.

The gate insulating layer 91 may be made of silicon nitride or silicon oxide material, and the specific structure of the gate insulating layer may be of a single-layer structure or a multi-layer structure, for example, stacked silicon oxide\silicon nitride.

The passivation layer 7 covering the TFTs may be made of silicon nitride or silicon oxide material, and the specific structure of the passivation layer may be of a single-layer structure or a multi-layer structure, for example, stacked silicon oxide\silicon nitride.

The flattening layer 9 used for providing the pixel electrodes with a planar substrate may be made of resin material.

The pixel electrodes 3 may specifically be made of transparent metal oxide conducting material such as Indium Tin Oxide (ITO), Indium Zinc Oxide (IZO) or Fluorine-Doped Tin Oxide (FTO).

The common electrodes 1 may also be made of transparent metal oxide conducting material such as ITO, IZO or FTO.

Figure 13:
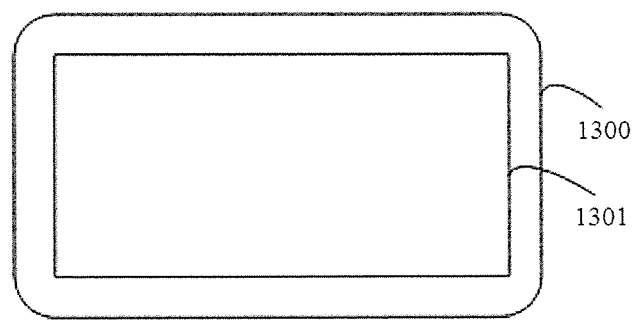
FIG. 13 is a diagram of a display device according to the embodiments of the present disclosure.

On this basis, some embodiments of the present disclosure further provide a display device 1300, including the display panel described above 1301, as shown in FIG. 13. The display device is specifically a liquid crystal display device, which may be a liquid crystal display, a liquid crystal TV set, a digital photo frame, a mobile phone, a tablet computer, a digital photo frame, a navigator or any product or component having a display function.

Additional embodiments including any one of the embodiments described above may be provided by the disclosure, where one or more of its components, functionalities or structures is interchanged with, replaced by or augmented by one or more of the components, functionalities or structures of a different embodiment described above.

The foregoing descriptions merely show specific implementations of the present disclosure, and the protection scope of the present disclosure is not limited thereto. Any person of ordinary skill in the art can readily conceive of variations or replacements within the technical scope disclosed by the present disclosure, and these variations or replacements shall fall into the protection scope of the present disclosure. Accordingly, the protection scope of the present disclosure shall be subject to the protection scope of the appended claims.

What is claimed is:

1. A display panel, comprising;
a base substrate;
a plurality of gate lines and a plurality of data lines arranged on the base substrate;
a plurality of pixel regions defined by the gate lines and the data lines being crisscrossed; and
pixel electrodes one of which arranged within each of the pixel regions;
wherein the display panel further comprises common electrodes arranged in opposite to the pixel electrodes; and, an orthographic projection of the common electrodes on the base substrate is not overlapped with an orthographic projection of the gate lines on the base substrate, and/or the orthographic projection of the common electrodes on the base substrate is not overlapped with an orthographic projection of the data lines on the base substrate.

2. The display panel according to claim 1, wherein:
the plurality of pixel regions are arranged in the array; and
the common electrodes are strip-shaped and arranged between two adjacent gate lines, and one common electrode corresponds to a row of the pixel electrodes.

3. The display panel according to claim 1, wherein:
the plurality of pixel regions are arranged in the array; and
the common electrodes are strip-shaped and arranged between two adjacent data lines, and one common electrode corresponds to a column of the pixel electrodes.

4. The display panel according to claim 1, wherein the display panel is provided with a display region, and the common electrodes are located within the display region; and
the display panel further comprises a common electrode frame arranged in the same layer as the common electrodes, with the common electrode frame being located outside the display region;
the first row of the common electrodes and the last row of the common electrodes being connected to the common electrode frame via the first connection electrodes; and
the first column of the common electrodes and the last column of the common electrodes being connected to the common electrode frame via the second connection electrodes.

5. The display panel according to claim 2, wherein the display panel is provided with a display region, and the common electrodes are at least located within the display region; and
the display panel further comprises a common electrode frame arranged in the same layer as the common electrodes, and the common electrode frame is located outside the display region and connected to each of the common electrodes corresponding to each row of the pixel electrodes.

6. The display panel according to claim 3, wherein the display panel is provided with a display region, and the common electrodes are at least located within the display region; and
the display panel further comprises a common electrode frame arranged in the same layer as the common electrodes, and the common electrode frame is located outside the display region and connected to each of the common electrodes corresponding to each column of the pixel electrodes.

7. The display panel according to claim 1, wherein the display panel further comprises a black matrix and a color film layer;
the black matrix is located between the base substrate and a layer where the pixel electrodes are located, and the black matrix comprises hollow regions in one-to-one correspondence to the pixel electrodes; and
the color film layer comprises color film blocks in one-to-one correspondence to the pixel electrodes, and each of the color film blocks is at least partially located within the hollow region.

8. The display panel according to claim 1, wherein the display panel further comprises an opposing substrate arranged in opposite to the base substrate;
all the gate lines, the data lines and the pixel electrodes are arranged on a side of the base substrate facing the opposing substrate; and
the common electrodes are arranged on a side of the opposing substrate facing the base substrate.

9. The display panel according to claim 1, wherein all the gate lines, the data lines, the pixel electrodes and the common electrodes are arranged on the base substrate; and
the common electrodes are located between the base substrate and the pixel electrodes, and slits are formed on the pixel electrodes;
or, the pixel electrodes are located between the base substrate and the common electrodes, and slits are formed on the common electrodes.

10. A display device, comprising the display panel according to claim 1.

* * * * *

UNITED STATES PATENT AND TRADEMARK OFFICE
CERTIFICATE OF CORRECTION

PATENT NO. : 10,627,680 B2
APPLICATION NO. : 15/935677
DATED : April 21, 2020
INVENTOR(S) : Hongfei Cheng et al.

Page 1 of 1

It is certified that error appears in the above-identified patent and that said Letters Patent is hereby corrected as shown below:

In the Claims
At Column 11, Line number 27, cancel the text beginning with "1. A display panel" to and ending with "the base substrate." at Column 11, Line 43 and insert the following claim:
--1. A display panel, comprising;
    a base substrate;
    a plurality of gate lines and a plurality of data lines arranged on the base substrate;
    a plurality of pixel regions defined by the gate lines and the data lines being crisscrossed; and
    pixel electrodes one of which arranged within each of the pixel regions;
    wherein the display panel further comprises common electrodes arranged in opposite to the pixel electrodes;
    and, an orthographic projection of the common electrodes on the base substrate is not overlapped with an orthographic projection of the gate lines on the base substrate, and/or the orthographic projection of the common electrodes on the base substrate is not overlapped with an orthographic projection of the data lines on the base substrate,
    the plurality of pixel regions are arranged in an array;
    the common electrodes are blocky and one of which is arranged within each of the pixel regions;
    the display panel further comprises a plurality of first connection electrodes and a plurality of second connection electrodes;
    each of the common electrode is electrically connected to another opposite common electrode in an adjacent row via the first connection electrode, and each of the common electrodes is electrically connected to another opposite common electrode in an adjacent column via the second connection electrode,
    the width of each of the first connection electrodes in a row direction is less than 1/4 of the length of an adjacent pixel electrode in the row direction which is adjacent to the first connection electrode on any side of the first connection electrode in the column direction;
        and/or,
    the width of each of the second connection electrodes in a column direction is less than 1/4 of the length of an adjacent pixel electrode in the column direction which is adjacent to the second connection electrode on any side of the second connection electrode in the row direction.--

Signed and Sealed this
Seventh Day of July, 2020

Andrei Iancu
*Director of the United States Patent and Trademark Office*